United States Patent
Hua et al.

(10) Patent No.: US 10,274,806 B2
(45) Date of Patent: Apr. 30, 2019

(54) PULSE-DIVIDING METHOD AND APPARATUS FOR A PULSED CARBON MONOXIDE LASER

(71) Applicant: Coherent, Inc., Santa Clara, CA (US)

(72) Inventors: Gongxue Hua, Unionville, CT (US); Eric R. Mueller, West Suffield, CT (US); Lanny Laughman, Bolton, CT (US)

(73) Assignee: Coherent, Inc., Santa Clara, CA (US)

( * ) Notice: Subject to any disclaimer, the term of this patent is extended or adjusted under 35 U.S.C. 154(b) by 83 days.

(21) Appl. No.: 15/339,531

(22) Filed: Oct. 31, 2016

(65) Prior Publication Data

US 2017/0131617 A1    May 11, 2017

Related U.S. Application Data

(60) Provisional application No. 62/251,941, filed on Nov. 6, 2015.

(51) Int. Cl.
*G02F 1/33* (2006.01)
*B23K 26/382* (2014.01)
(Continued)

(52) U.S. Cl.
CPC ........... *G02F 1/33* (2013.01); *A45D 19/0008* (2013.01); *A45D 24/22* (2013.01); *B23K 26/064* (2015.10); *B23K 26/067* (2013.01); *B23K 26/0622* (2015.10); *B23K 26/0673* (2013.01); *B23K 26/382* (2015.10); *H01S 3/0085* (2013.01); *H01S 3/2232* (2013.01); *H05K 3/0026* (2013.01); *A45D 2019/0083* (2013.01);
(Continued)

(58) Field of Classification Search
CPC ..... G02F 1/33; B23K 26/382; B23K 2201/42; B23K 26/06–26/0652; B23K 26/38; B23K 26/381; B23K 26/4075; B23K 26/425; H01S 3/0085; H01S 3/2232; H05K 3/0026; H05K 2203/107
USPC .......................... 219/121.6–121.83; 359/310
See application file for complete search history.

(56) References Cited

U.S. PATENT DOCUMENTS 3,935,419 A    1/1976    Lambert et al.
3,953,850 A    4/1976    Redman
(Continued)

FOREIGN PATENT DOCUMENTS

DE    102007032903 A1    1/2009
GB       2338201 A       12/1999
WO    2015/041827 A2    3/2015

OTHER PUBLICATIONS

Chang et al., "Design of a Double-Pass Shear Mode Acousto-Optic Modulator", Review of Scientific Instruments, vol. 79, No. 033104, 2008, pp. 033104-1-033104-5.
(Continued)

*Primary Examiner* — Wen Huang
(74) *Attorney, Agent, or Firm* — Morrison & Foerster LLP

(57) ABSTRACT

Laser-drilling apparatus includes a gas-discharge for laser emitting laser-radiation pulses, and two acousto-optic modulators (AOMs). The laser radiation pulses are characterized as having two temporal central portions between temporal leading and trailing edge portions. The AOMs are arranged to spatially separate the central temporal portions of the pulses from each other and from the leading and trailing edge portions of the pulses.

5 Claims, 4 Drawing Sheets

(51) Int. Cl.
  *H01S 3/00*  (2006.01)
  *H01S 3/223*  (2006.01)
  *H05K 3/00*  (2006.01)
  *A45D 19/00*  (2006.01)
  *A45D 24/22*  (2006.01)
  *B23K 26/067*  (2006.01)
  *B23K 26/064*  (2014.01)
  *B23K 26/0622*  (2014.01)
  *B23K 101/42*  (2006.01)

(52) U.S. Cl.
  CPC .... *A45D 2200/058* (2013.01); *B23K 2101/42* (2018.08); *G02F 2203/26* (2013.01); *H05K 2203/107* (2013.01)

(56) References Cited

U.S. PATENT DOCUMENTS

| | | | |
|---|---|---|---|
| 4,206,347 A | 6/1980 | Avicola et al. | |
| 4,321,564 A | 3/1982 | Tregay | |
| 5,105,304 A | 4/1992 | Tanaka et al. | |
| 5,890,789 A | 4/1999 | Inagaki et al. | |
| 5,910,262 A | 6/1999 | Baumgart et al. | |
| 6,052,216 A | 4/2000 | Rolfe et al. | |
| 6,107,599 A | 8/2000 | Baumgart et al. | |
| 6,576,869 B1 | 6/2003 | Gower et al. | |
| 6,618,070 B2 | 9/2003 | Fischer et al. | |
| 6,784,399 B2 | 8/2004 | Dunsky et al. | |
| 6,826,204 B2 | 11/2004 | Kennedy et al. | |
| 7,003,003 B2 | 2/2006 | Mueller et al. | |
| 7,039,079 B2 | 5/2006 | Seguin et al. | |
| 7,058,093 B2 | 6/2006 | Kennedy et al. | |
| 7,375,819 B2 | 5/2008 | Courville et al. | |
| 7,453,918 B2 | 11/2008 | Laughman et al. | |
| 7,508,850 B2 | 3/2009 | Newman et al. | |
| 7,593,158 B2 | 9/2009 | Wilhelm et al. | |
| 7,675,673 B2 | 3/2010 | Mueller | |
| 7,756,186 B2 | 7/2010 | Chenausky et al. | |
| 7,817,685 B2 | 10/2010 | Osaka et al. | |
| 8,050,306 B2 | 11/2011 | Seguin et al. | |
| 9,414,498 B2 | 8/2016 | Hua et al. | |
| 2002/0191264 A1* | 12/2002 | Vernackt | G02F 1/11 359/237 |
| 2004/0222197 A1 | 11/2004 | Hiramatsu | |
| 2006/0114948 A1 | 6/2006 | Lo et al. | |
| 2007/0215575 A1 | 9/2007 | Gu et al. | |
| 2009/0147344 A1 | 6/2009 | Lovering et al. | |
| 2009/0236323 A1 | 9/2009 | Sun et al. | |
| 2010/0193481 A1 | 8/2010 | Osako | |
| 2011/0259860 A1 | 10/2011 | Bass et al. | |
| 2013/0154159 A1 | 6/2013 | Noel et al. | |
| 2014/0185119 A1 | 7/2014 | Staver | |
| 2014/0231085 A1 | 8/2014 | Zediker et al. | |
| 2015/0083698 A1 | 3/2015 | Hua et al. | |
| 2017/0023843 A1 | 1/2017 | Seifert | |

OTHER PUBLICATIONS

Donley, et al., "Double-Pass Acousto-Optic Modulator System", Review of Scientific Instruments, vol. 76, No. 063112, 2005, pp. 063112-1-063112-6.

International Preliminary Report on Patentability received for PCT Patent Application No. PCT/US2014/053129, dated Mar. 31, 2016, 6 pages.

International Search Report and Written Opinion received for PCT Patent Application No. PCT/US2014/053129, dated Mar. 19, 2015, 10 pages.

International Search Report and Written Opinion received for PCT Patent Application No. PCT/US2016/060069, dated Feb. 7, 2017, 12 pages.

Non-Final Office Action received for U.S. Appl. No. 14/033,246, dated Sep. 17, 2015, 9 pages.

Non-Final Office Action received for U.S. Appl. No. 14/803,460, dated Oct. 31, 2016, 14 pages.

Notice of Allowance received for U.S. Appl. No. 14/033,246, dated Apr. 18, 2016, 7 pages.

* cited by examiner

PULSE-DIVIDING METHOD AND APPARATUS FOR A PULSED CARBON MONOXIDE LASER

PRIORITY CLAIM

This application claims priority of U.S. Provisional Application No. 62/251,941, filed Nov. 6, 2015, the complete disclosure of which is hereby incorporated herein by reference.

TECHNICAL FIELD OF THE INVENTION

The present invention relates in general to methods of operating a pulsed carbon monoxide (CO), gas-discharge laser. The invention relates in particular to methods of temporally shaping pulses from such a CO laser.

DISCUSSION OF BACKGROUND ART

CO gas-discharge lasers with average output power greater than 250 Watts (W) have recently become commercially available. Such lasers have been accepted as advantageous for certain laser-machining operations, particularly laser-drilling of via-holes in printed circuit boards PCBs.

Via-hole drilling using a pulsed CO laser is described in detail in U.S Pre-grant Publication No. 2015/0083698, assigned to the assignee of the present invention, and the complete disclosure of which is hereby incorporated herein by reference. In this method, pulses from a CO laser are temporally shaped by removing leading and trailing edges of the pulse with slow rise and fall times. An acousto-optic modulator (AOM) is used for this operation. The AOM is operated to pass the unwanted leading and trailing edges of pulse directly with the AOM turned "off", and to diffract a wanted, temporally shaped portion, of the pulse along a path to the workpiece (PCB). Means are provided for compensating for spectral (chromatic) dispersion introduced into the temporally shaped pulse by the diffraction of the AOM.

In preferred embodiments of the above referenced via-hole drilling operation, the drilling is performed on one workpiece at a time. Operational productivity could be increased by adapting the method for operating on two or more workpieces at a time.

SUMMARY OF THE INVENTION

In one aspect, laser apparatus in accordance with the present invention comprises first and second acousto-optic modulators (AOMs) and a gas-discharge laser for emitting laser-radiation pulses. The laser-radiation pulses have a temporal rising-edge portion, a temporal falling-edge portion, with first and second temporal central portions therebetween. The first and second AOMs are arranged and operated to spatially separate the first and second temporal central portions of the pulses from the leading-edge and trailing-edge portions of the pulses, and spatially separate the first and second temporal central portions of the pulses from each other.

DETAILED DESCRIPTION OF THE INVENTION

Figure 1A:
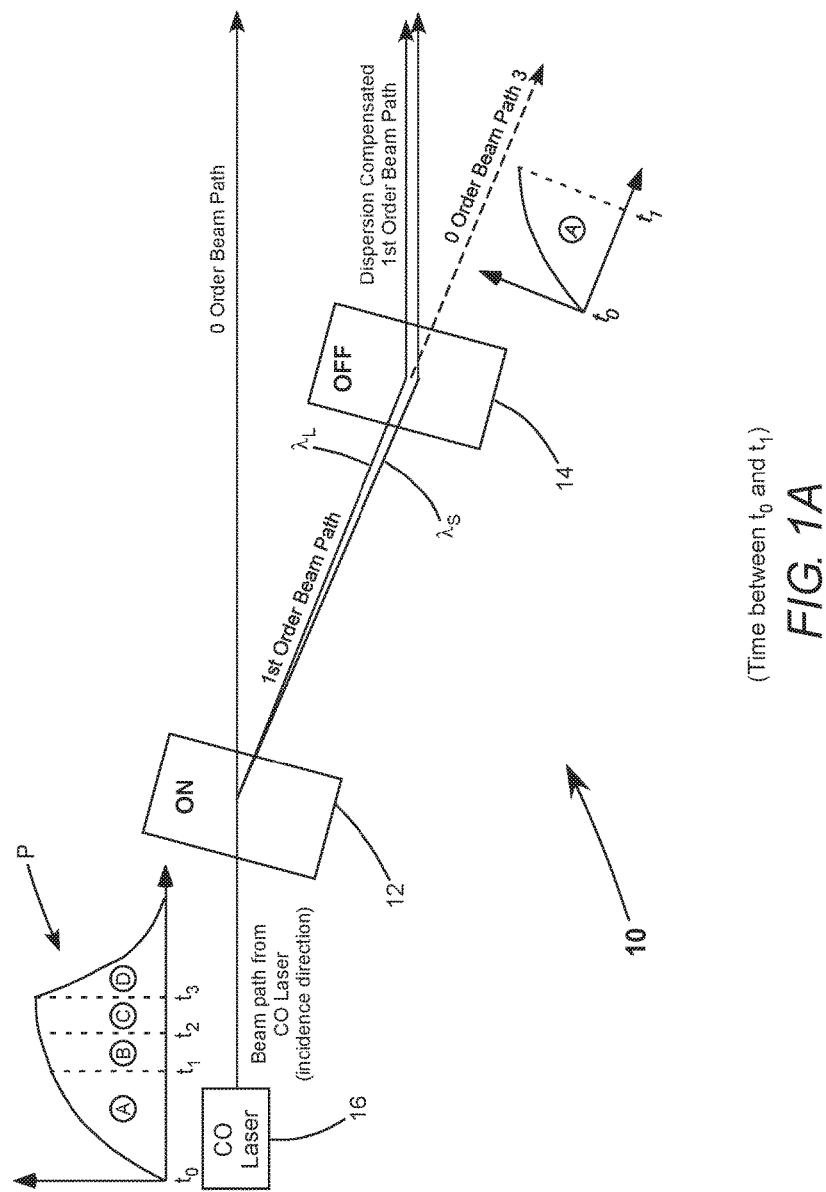
FIG. 1A, FIG. 1B, FIG. 1C, and FIG. 1D schematically illustrate a preferred embodiment of pulse-dividing apparatus in accordance with the present invention at four different time intervals during passage of a pulse of laser-radiation through the apparatus.

Turning now to the drawings, FIG. 1A schematically illustrates a preferred embodiment 10 of pulse-dividing apparatus in accordance with the present invention for time-dividing a pulse P into useful portions B and C, and leading and trailing edge portions A and D, respectively. Pulse-portion A occurs between times to (pulse-initiation) and time $t_1$. Pulse-portion B occurs between times $t_1$ and $t_2$. Pulse-portion C occurs between times $t_2$ and $t_3$. Pulse-portion D occurs at times greater than or equal to time $t_3$.

Apparatus 10 comprises first and second acousto-optic modulators (AOMs) 12 and 14, respectively. Pulse P is delivered by a carbon monoxide (CO) laser 16, or any other gas discharge laser capable of lasing simultaneously at a plurality of different wavelengths between a shortest wavelength $\lambda_S$ and a longest wavelength $\lambda_L$. In a CO laser, $\lambda_S$ may be about 4.5 micrometers (μm) and $\lambda_L$ may be about 6.0 μm.

The drawing depicts three possible beam-paths through apparatus 10. Beam-path 1 is the path of radiation transmitted through AOM without diffraction, i.e., beam-path 1 is a zero-order path of AOM 12, and is parallel to the incidence direction of pulse P on AOM 12. When AOM 12 is in an "ON" condition, i.e., with radio-frequency (RF) power applied to the AOM, the longest and shortest wavelengths are diffracted at different angles, as illustrated in the drawing. The diffraction angles are dependent on the applied radio-frequency.

AOM 14 can be operated at the same frequency as AOM 12 for compensating dispersion introduced in a diffracted beam by AOM 12, as is known in the art. Beam-path 2 is the diffracted first-order beam from AOM 12, dispersion-compensated by AOM 14. When the AOMs are operated at a common frequency, beam-path 2 is parallel to beam-path 1. Beam-path 2 is spread in the plane of the drawing dependent on the longest and shortest wavelengths diffracted, and on the separation distance of AOMs 12 and 14. Beam-path 3 is a zero-order beam-path of AOM 14. Radiation on this path is not dispersion-compensated.

It should be noted here that only sufficient description of dispersion compensation is provided herein for understanding time-division principles of the present invention. A more detailed description of various AOM dispersion-compensation arrangements is provided in the above-referenced 2015/0083698 publication.

Continuing with reference to FIG. 1A, in a time interval between time to and time $t_1$ corresponding to leading edge portion A of a pulse P, AOM 12 is in an "ON" condition (RF applied and diffracting) and AOM 14 is in an "OFF" condition, i.e., with zero or low RF applied. Radiation from pulse P is diffracted by AOM 12 along a first-order beam-path toward AOM 12 and is transmitted along the zero-order beam-path of AOM 12 into beam-path 3 to a radiation dump (not shown).

Figure 1B:
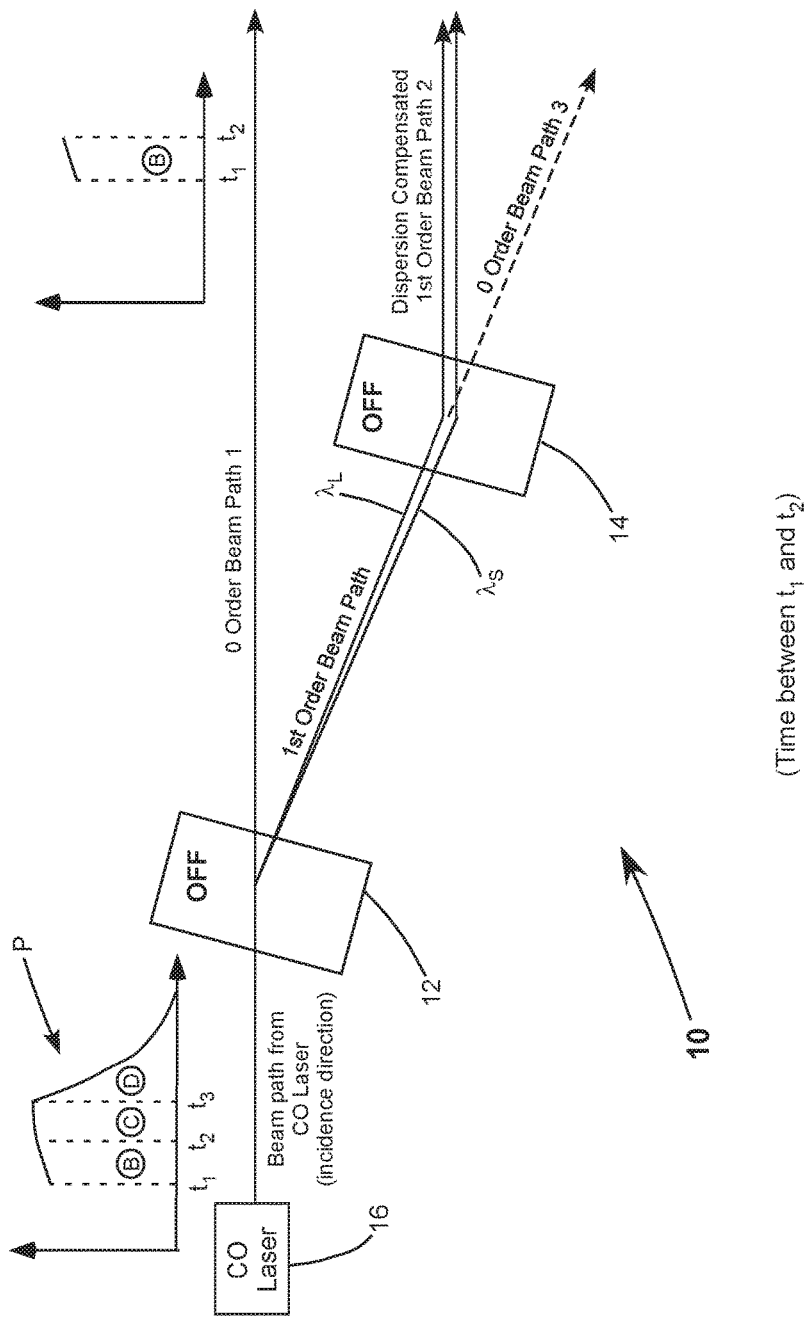

Referring now to FIG. 1B, at time $t_1$, AOM 12 is switched OFF, allowing radiation from pulse B to be transmitted along beam-path 1 (the zero order beam-path of AOM 12) to a first target (not shown). Both AOMs remain "OFF" until time $t_2$ such that portion B of pulse P is transmitted along beam-path 1 to the target. Here it should be noted that having AOM 14 "OFF" during the period between is preferred for preventing any "leakage" of radiation along the first-order beam-path of AOM 12 from entering beam-path 2. Weak RF power could be selectively applied to AOM 12 to adjust the amplitude of pulse-portion B.

Figure 1C:
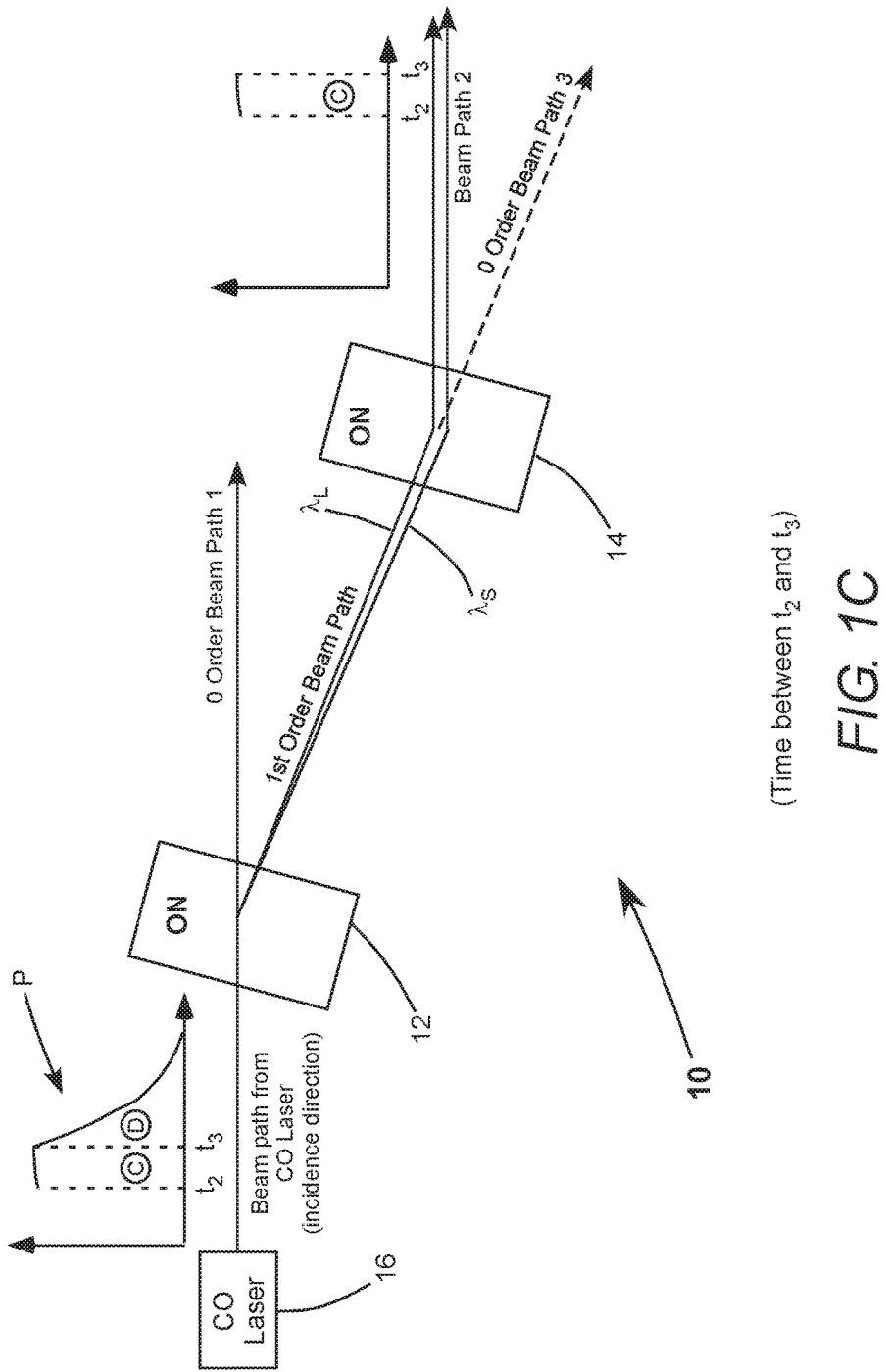

Referring to FIG. 1C, at time $t_2$ and until time $t_3$, AOM 12 and AOM 14 are both switched "ON" causing radiation from pulse P to be diffracted by AOM 12 along the first-order beam-path thereof to AOM 14, then diffracted by AOM 14, thereby directing portion C of pulse P along beam-path 2 to a second target (not shown). It is assumed here that during the time interval between time $t_2$ and time $t_3$, both AOMs are operating at the same frequency. RF power to AOM 14 could be adjusted to control the power in pulse-portion C.

Figure 1D:
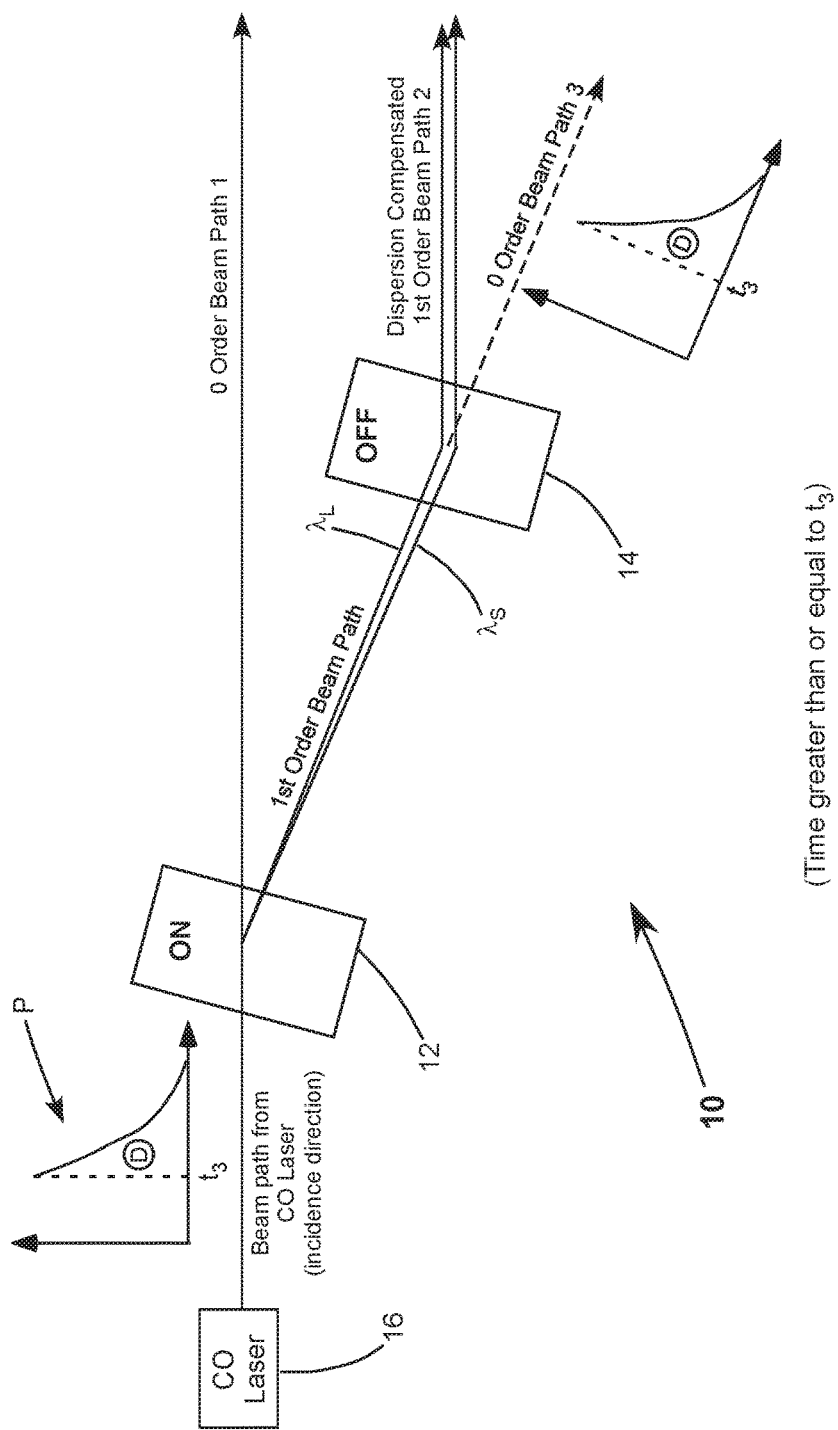

Referring to FIG. 1D, at time $t_3$, AOM 14 is switched "OFF", allowing the remainder of radiation in pulse P (trailing-edge portion D thereof) to be transmitted along beam-path 3. The above-described switching sequence can be repeated with the arrival of each pulse arriving at AOM 12 from the CO laser.

Those skilled in the art will recognize that certain modifications of apparatus 10 are possible without departing from the sprit and scope of the present invention. By way of example, the spread due to dispersion in the first order beam-path from AOM 12 to AOM 14 could be reduced by inserting a unit-magnification optical relay between AOM 12 and AOM 14. Various beam-steering or beam-shaping arrangements could be included between AOMs 12 or 14 and the first or second targets. Typically, beam-path 1 and beam-path two would each include achromatic focusing elements for focusing the pulse portion on the respective targets, as described in the above-referenced 2015/0083698 publication.

From the description of the present invention provided above, those skilled in the art will recognize that further time-division of a CO laser pulse is possible, in theory at least, without departing from the spirit and scope of the present invention. By way of example, if in the time-interval between $t_2$ and $t_3$ of FIG. 1C, the radio-frequency applied to AOMs 12 and 14 were switched to a different, common frequency, then dispersion-compensated first-order, beam-path 2 from AOM 14 would be shifted, up or down in the plane of the drawing, to provide a third beam-path, parallel to the second beam-path, for a portion of the transmitted pulse-portion. This would allow a third target to be irradiated by radiation from pulse P.

The present invention is described above with reference to a preferred embodiment. The invention is not limited, however, to the embodiment described and depicted herein. Rather the invention is limited only by the claims appended hereto.

The invention claimed is:

1. Apparatus for laser-drilling a work-piece, comprising:
first and second acousto-optic modulators (AOMs);
a carbon monoxide (CO) laser emitting laser-radiation pulses with radiation in the pulses having a plurality of wavelengths in a wavelength range between about 4.5 micrometers and about 6.0 micrometers, the laser-radiation pulses having a temporal rising-edge portion, a temporal falling-edge portion, and first and second temporal central portions therebetween, and the laser radiation pulses being incident on the first AOM in a first incidence direction;
the first AOM being arranged and operated to receive the laser-radiation pulses and to diffract the temporal rising- and falling-edge portions and one of the first and second temporal central portions of the pulses along first wavelength-dependent first-diffraction-order directions at angles to the first incidence direction, said diffracted portions of the pulses being angularly dispersed as a function of wavelength, said first AOM transmitting the other of the first and second temporal central portions of the radiation pulses along a first zero-order direction parallel to the first incidence direction; and
the second AOM being arranged and operated to receive the diffracted pulse-portions from the first AOM, diffract the other of the first and second temporal pulse portions along second wavelength-dependent first diffraction-order directions, and transmit the temporal rising- and falling-edge portions along second zero-order directions at an angle to the second wavelength-dependent first diffraction-order directions with the first and second temporal central portions being used for drilling the work-piece and wherein the diffraction by the second AOM reduces the angular wavelength dispersion of the temporal portion of the pulse created by diffraction in the first AOM.

2. The apparatus of claim 1, wherein the first and second AOMs are arranged and operated such that the first zero-order direction and second wavelength-dependent first diffraction-order directions are about parallel to each other.

3. A method of slicing laser pulses with first and second acousto-optic modulators (AOMs), each of said laser pulses having a temporal rising-edge portion, a temporal falling-edge portion, and first and second temporal central portions therebetween, said laser pulses being generated by a carbon monoxide laser emitting laser-radiation pulses with radiation in the pulses having a plurality of wavelengths in a wavelength range between about 4.5 micrometers and about 6.0 micrometers, said method comprising the steps of:
directing a pulse to the first AOM;
during a first time period, activating the first AOM so that the temporal rising-edge portion of the pulse is diffracted along a path to the second AOM, and during said first time period, deactivating the second AOM so that the temporal rising-edge portion of the pulse is not diffracted and is directed to a beam dump;
during a second time period, deactivating the first AOM so that the first temporal central portion of the pulse is not diffracted and is directed along a path to a work-piece;
during a third time period, activating both the first and second AOMs so that the second temporal central portion is diffracted by both the first and second AOMs and is directed along a path to a work-piece and wherein angular wavelength dispersion induced by diffraction in the first AOM in the second temporal central portion is compensated by diffraction in the second AOM; and
during a fourth time period, activating the first AOM and deactivating the second AOM so that the temporal falling-edge portion of the pulse is diffracted by the first AOM and not diffracted by the second AOM and is directed to a beam dump.

4. The method of claim 3 wherein the first and second AOMs are positioned such that the path of the laser pulse exiting the first AOM when the first AOM is deactivated is parallel to and spaced apart from the path of the laser pulse exiting the second AOM when the second AOM is activated.

5. A method of slicing laser pulses with first and second acousto-optic modulators (AOMs), each of said laser pulses having a temporal rising-edge portion, a temporal falling-edge portion, and first and second temporal central portions therebetween, said laser pulses being generated by a carbon monoxide laser emitting laser-radiation pulses with radiation in the pulses having a plurality of wavelengths in a wavelength range between about 4.5 micrometers and about 6.0 micrometers, said method comprising the steps of:

(a) directing a pulse to the first AOM;
(b) during a first time period, activating the first AOM so that the temporal rising-edge portion of the pulse is diffracted along a path to the second AOM, and during said first time period, deactivating the second AOM so that the temporal rising-edge portion of the pulse is not diffracted and is directed to a beam dump;
(c) during a second time period, performing one of steps (d) or (e)
(d) deactivating the first AOM so that one of the first and second temporal central portions of the pulse is not diffracted and is directed to a work-piece; or
(e) activating both the first and second AOMs so that the one of the first and second temporal central portions is diffracted by both the first and second AOMs and is directed to a work-piece and wherein angular wavelength dispersion induced by diffraction in the first AOM in said one temporal central portion is compensated by diffraction in the second AOM;
(f) during a third time period, performing the other of steps (d) or (e) on the other temporal central portion of the pulse; and
(g) during a fourth time period, activating the first AOM and deactivating the second AOM so that the temporal falling-edge portion of the pulse is diffracted by the first AOM and not diffracted by the second AOM and is directed to a beam dump.

* * * * *